US006727125B2

(12) United States Patent
Adachi et al.

(10) Patent No.: US 6,727,125 B2
(45) Date of Patent: Apr. 27, 2004

(54) MULTI-PATTERN SHADOW MASK SYSTEM AND METHOD FOR LASER ANNEALING

(75) Inventors: Masahiro Adachi, Vancouver, WA (US); Apostolos T. Voutsas, Vancouver, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 0 days.

(21) Appl. No.: 10/124,853

(22) Filed: Apr. 17, 2002

(65) Prior Publication Data

US 2003/0199176 A1 Oct. 23, 2003

(51) Int. Cl.[7] .............................................. H01L 21/00
(52) U.S. Cl. ...................... 438/166; 438/480; 438/413
(58) Field of Search ...................... 438/480, 53, 345, 438/446, 386, 166, 413, 585, 52, 905; 445/3, 30; 219/121.62, 121.83, 121.61, 121.65; 427/282, 58, 96

(56) References Cited

U.S. PATENT DOCUMENTS

| | | | | | |
|---|---|---|---|---|---|
| 4,667,109 A | * | 5/1987 | Kano | ...................... | 250/461.1 |
| 5,074,667 A | * | 12/1991 | Miyatake | ...................... | 356/401 |
| 5,083,466 A | * | 1/1992 | Holm-Kennedy et al. | ...................... | 73/862.041 |
| 5,138,176 A | * | 8/1992 | Nishi | ...................... | 250/548 |
| 5,145,432 A | * | 9/1992 | Midland et al. | ...................... | 445/3 |
| 5,703,675 A | * | 12/1997 | Hirukawa et al. | ...................... | 355/53 |
| 6,249,335 B1 | * | 6/2001 | Hirukawa et al. | ...................... | 355/53 |
| 6,261,406 B1 | * | 7/2001 | Jurgensen et al. | ...................... | 156/345.3 |
| 6,274,198 B1 | * | 8/2001 | Dautartas | ...................... | 427/282 |
| 6,281,470 B1 | * | 8/2001 | Adachi | ...................... | 219/121.62 |
| 6,322,625 B2 | | 11/2001 | Im | ...................... | 117/43 |
| 6,642,091 B1 | * | 11/2003 | Tanabe | ...................... | 438/166 |

* cited by examiner

Primary Examiner—Carl Whitehead, Jr.
Assistant Examiner—Laura M Schillinger
(74) Attorney, Agent, or Firm—David C. Ripma; Matthew D. Rabdau

(57) ABSTRACT

A multi-pattern shadow mask, shadow mask laser annealing system, and a multi-pattern shadow mask method for laser annealing are provided. The method comprises: supplying a silicon substrate; supplying a multi-pattern shadow mask with a plurality of aperture patterns; creating substrate alignment marks; with respect to the alignment marks, laser annealing a substrate region in a plurality of aperture patterns; forming a corresponding plurality of polysilicon regions; and, forming a corresponding plurality of transistor channel regions in the plurality of polysilicon regions. Typically, the shadow mask includes a plurality of sections, with each section having at least one aperture pattern. A shadow mask section can be selected to create a corresponding aperture pattern. If the mask section includes a plurality of aperture patterns, the selection of a section creates all the corresponding aperture patterns in the selected section.

14 Claims, 6 Drawing Sheets

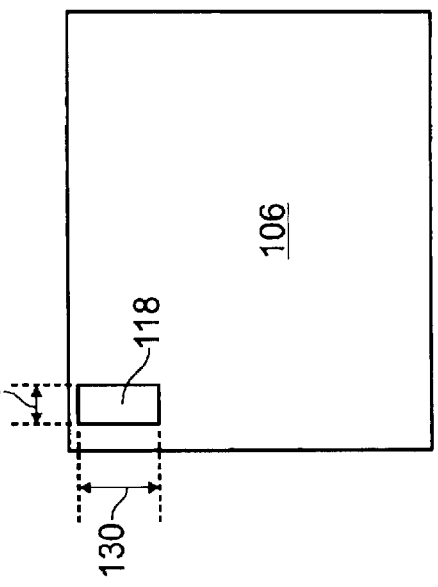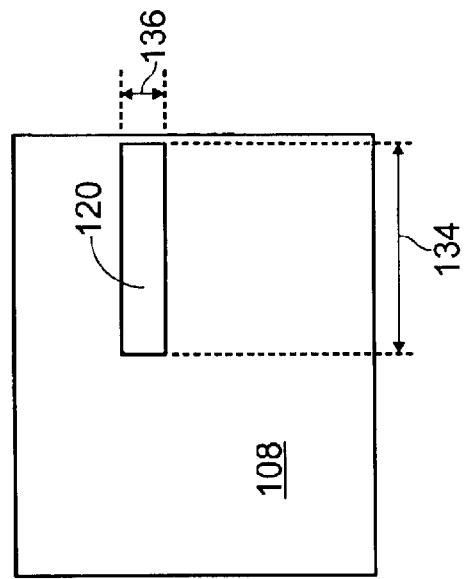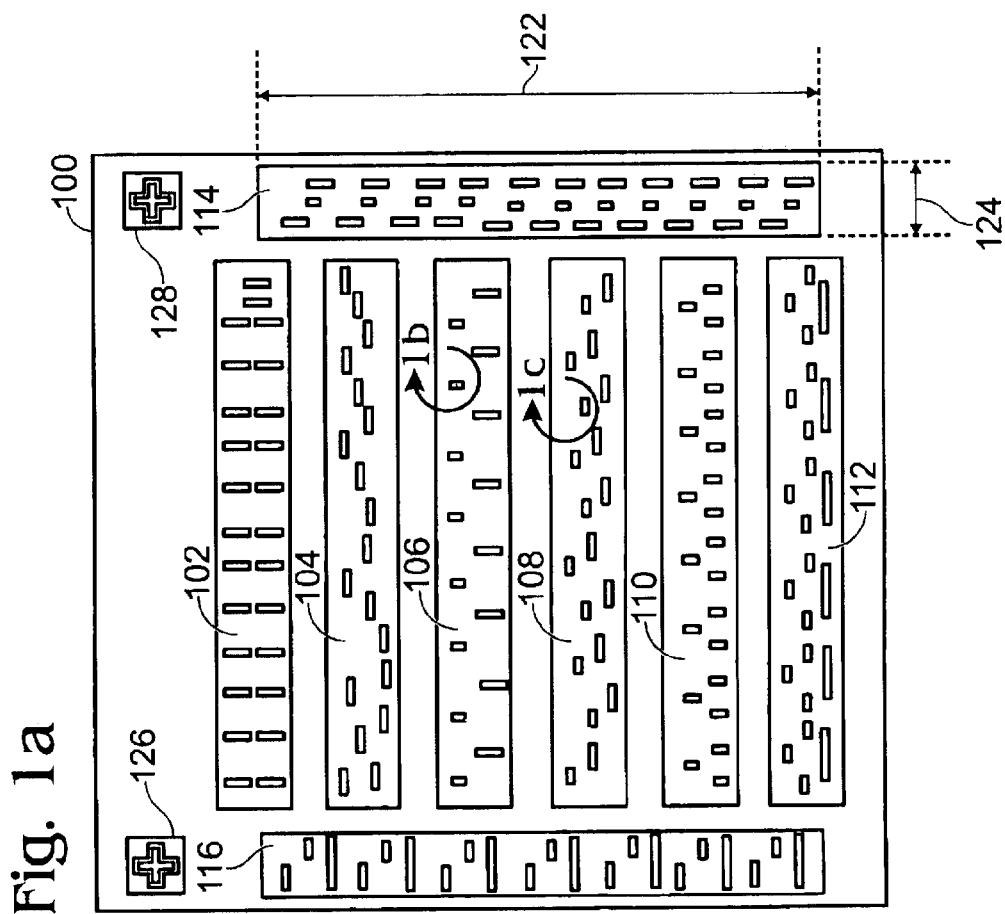

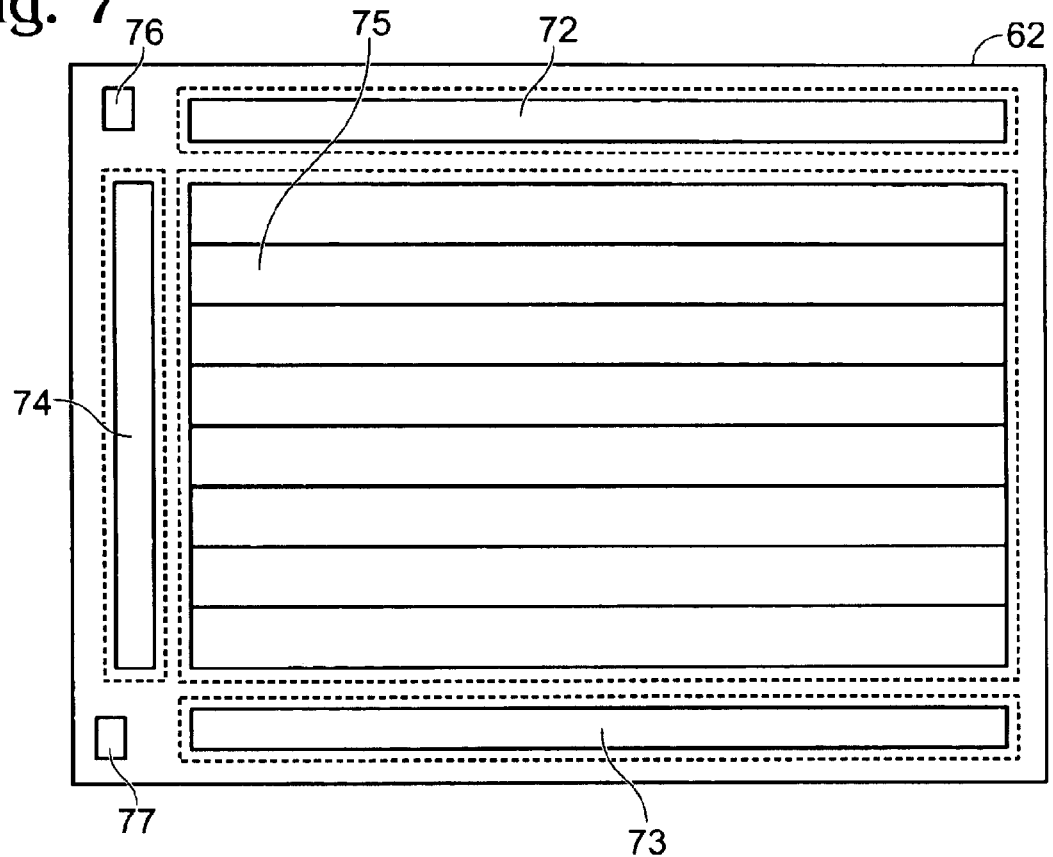

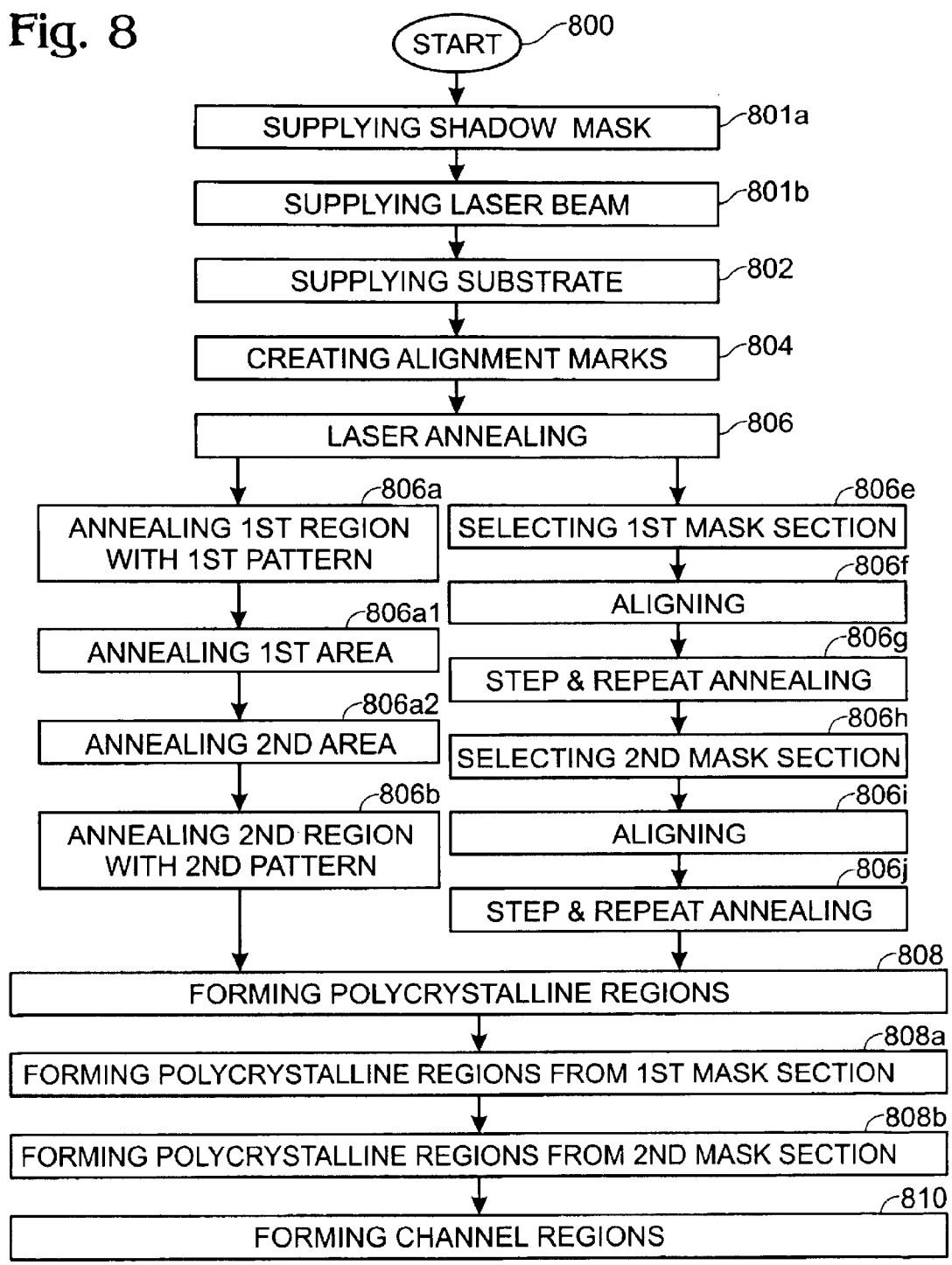

MULTI-PATTERN SHADOW MASK SYSTEM AND METHOD FOR LASER ANNEALING

BACKGROUND OF THE INVENTION

1. Field of the Invention

This invention generally relates to the fabrication of thin film transistors (TFTs) for liquid crystal displays (LCDs) and, more particularly, to a system and method for using a shadow mask for the laser annealing of silicon substrates, to form precisely located polysilicon or single crystal active regions.

2. Description of the Related Art

The TFTs used in LCD active layer are made from either polycrystalline or single grain crystalline silicon (Si) films that are crystallized in response to laser annealing an amorphous silicon precursor film. These TFTs are used to form pixel switching devices, and/or LCD peripheral circuits, and/or electro-luminescence displays. They are also used in the fabrication of various integrated circuits like sensor arrays on a glass substrate.

A major industrial application of poly-Si thin film transistors (TFT) is LCD panels with driver circuit integration on the substrates. The quality of poly-Si (polycrystallized silicon) film that is the semiconductor layer of the transistors is one of the most important factors in the formation of TFTs, and directly affects the circuit performance. Poly-Si films typically consist of crystal grains and boundaries between the grains. The grains often include crystal defects. One approach for the improvement of the poly-Si film quality is in the use of a laser annealing method that can crystallize amorphous silicon precursor into a poly-Si film with fewer intra-grain defects.

High-performance TFTs require high electron mobility through the transistor channel region. One TFT fabrication problem is in the control of these channel locations on the substrate. That is, the channels must be located in predetermined substrate areas that are formed from either polycrystalline of single crystal material. Likewise, the orientation, or "direction" of the transistor channel is important when fitting the channel regions inside polycrystalline regions.

As a next generation laser annealing technology, a laser induced lateral growth crystallization technique is described in U.S. Pat. No. 6,322,625 (Im). This technology features the seed area of the film being localized by laser beam irradiation, defined through a patterned projection mask that is a shadow mask. Localized solidification occurs laterally from the seed area. By the use of this technique, the quality of the localized area in the poly-Si film is improved. Along the direction of lateral growth, the grain boundaries can be reduced dramatically. However, in the perpendicular direction the grain boundaries are likely to be degraded even further. Therefore, the best performing TFTs have channel regions are formed in the localized high quality poly-Si area, with channels formed in a direction parallel to the lateral growth. Using this process, a semiconductor material having regular, quasi-regular, or single-crystal structure can be made by a technique involving localized irradiation of the film with one or several pulses of a beam of laser radiation. A patterned projection mask defines the localized irradiation of the laser beam. The technique can be used in the manufacture of high-speed liquid crystal display devises, wherein pixel switches or/and driver circuitry are made in single-crystal or regular polycrystalline films.

A technique of locating transistor channels in a polycrystalline silicon film is disclosed in U.S. Pat. No. 6,281,470 (Adachi). The active layer of all the semiconductor elements are formed in alternating regions of silicon film having different crystallization characteristics. However, this process has profound limitations as an efficient fabrication procedure.

It would be advantageous if transistor channels could be defined more precisely in predetermined polycrystalline, or single crystal substrate regions.

It would be advantageous if a shadow mask laser annealing process could be used more for more precisely locating transistor channel regions.

SUMMARY OF THE INVENTION

The present invention laser annealing system and method features the use of a shadow mask for the patterned projection of a laser beam. The mask is divided into block patterns called sections. The mask has the capability of making alignment marks for the exposure equipment that permits precision alignment. The mask also permits multi-shot laser irradiation. Because of these features, the present invention laser annealing apparatus is able to supply higher performance TFTs and higher yields. The apparatus can control the location and direction of the localized high quality poly-Si area, to match to the layout design (formation) of the TFT channel regions.

The present invention shadow mask includes a plurality of sections with the different aperture patterns, corresponding the layout design of the poly-Si TFT channel regions. Some aperture patterns are designed to form a seed portion of the poly-Si material that is grown laterally by stepping the position of the laser beam, through the same aperture pattern, across the substrate. Other aperture patterns form an alignment mark that is used by the exposure apparatus to precisely define the location of poly-Si islands and localized high quality poly-Si areas. The irradiation can be done with plurality of shots per at the same substrate position through an area of the patterned projection mask to avoid the defects of the poly-Si film caused by the fluctuation in the power of laser beam.

Accordingly, a multi-pattern shadow mask method is provided for laser annealing, the method comprises: supplying a silicon substrate; supplying a multi-pattern shadow mask with a plurality of aperture patterns; creating substrate alignment marks; with respect to the alignment marks, laser annealing a substrate region in a plurality of aperture patterns; forming a corresponding plurality of polysilicon regions; and, forming a corresponding plurality of transistor channel regions in the plurality of polysilicon regions.

In some aspects of the method, laser annealing in a plurality of aperture patterns includes: laser annealing a first area in a substrate region with a first aperture pattern; and, step-and-repeat laser annealing in a second area, adjacent the first area, in the substrate region. Then, forming a corresponding plurality of polycrystalline regions includes laterally growing crystals in response to the step-and-repeat laser annealing process.

Typically, the shadow mask includes a plurality of sections, with each section having at least one aperture pattern. A shadow mask section can be selected to create a corresponding aperture pattern. If the mask section includes a plurality of aperture patterns, the selection of mask section creates all the corresponding aperture patterns in the selected section.

More specifically, using the shadow mask to create the plurality of aperture patterns includes: selecting a first mask section with a plurality of aperture patterns; using the alignment marks, aligning the substrate with the first mask; using the first mask section to step-and repeat laser anneal regions in the substrate with the plurality of aperture patterns; selecting a second mask section with a plurality of aperture patterns; using the alignment marks, aligning the substrate with the second mask; using the second mask section to step-and repeat laser anneal regions in the substrate with the plurality of aperture patterns. Then, forming polycrystalline regions in a plurality of patterns includes: forming a plurality of polycrystalline patterns in response to laser annealing with the first mask section; and, forming a plurality of polycrystalline patterns in response to laser annealing with the second mask section.

Additional details of the above-described method, a multi-pattern shadow mask, and a multi-pattern shadow mask annealing system are described below.

BRIEF DESCRIPTION OF THE DRAWINGS

FIGS. 1a through 1c are plan views of an exemplary present invention multi-pattern shadow mask.

FIG. 7 is a detailed depiction of the first panel of FIG. 6.

FIG. 8 is a flowchart illustrating the present invention multi-pattern shadow mask method for laser annealing.

DETAILED DESCRIPTION OF THE PREFERRED EMBODIMENTS

Figure 2:
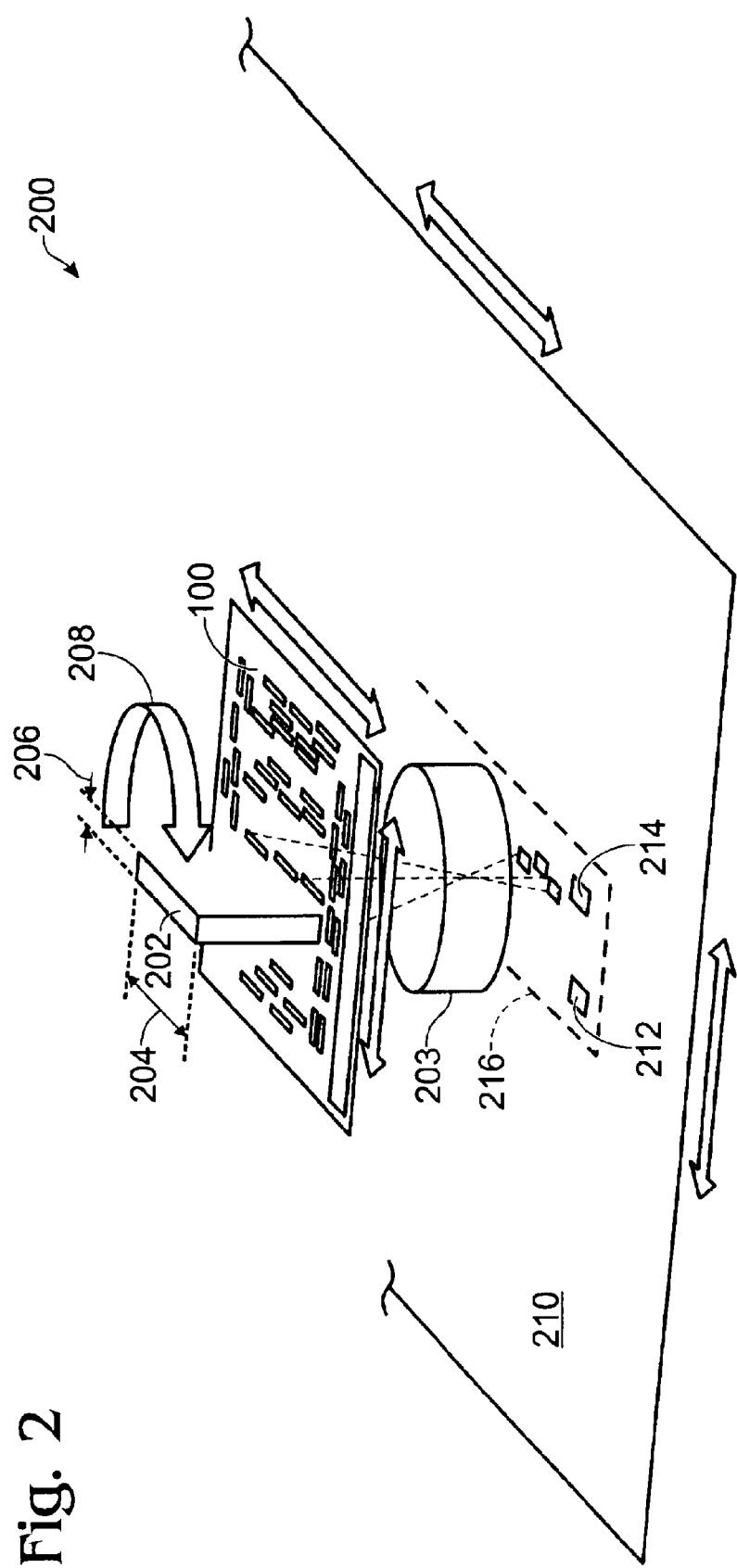
FIG. 2 is a perspective view of the present invention multi-pattern shadow mask laser annealing system.

FIGS. 1a through 1c are plan views of an exemplary present invention multi-pattern shadow mask. As shown in FIG. 1a, the mask 100 comprises a plurality of shadow mask sections with apertures. Shown are sections 102, 104, 106, 108, 110, 112, 114, and 116. Each section includes at least one substrate alignment aperture. As seen in FIG. 1a, mask section 106 includes at least two aperture patterns. In FIG. 1b, aperture pattern 118 is shown in detail. Likewise, FIG. 1c shows aperture pattern 120 of mask section 108 is detail. Returning to FIG. 1a, it can be seen that the mask 100 includes a plurality of laser annealing aperture patterns and that each mask section includes at least one pattern of apertures. As in section 106 for example, each section often includes apertures in a plurality of patterns.

It is typical that each mask section is defined as a rectangle with a length and width. For example, mask section 114 is shown as having a length 122 and a width 124. However, the present invention mask sections are not limited to any particular shape. It is also typical to transversely locate the rectangular mask sections on the mask 100. For example, mask section 112 is transversely located, or perpendicular to mask section 114.

The shadow mask 100 includes at least one registration section with at least one substrate alignment aperture for forming a position reference mark on a substrate. The shadow mask 100 includes at least two corners, with a first registration section 126 formed in a first mask corner and a second registration section 128 formed in a second mask corner. The aperture pattern shown is a cross shape. However, the registration section need not be placed in the corners of the mask 100, and the aperture pattern need not necessarily be shaped as shown.

Returning to FIG. 1b, mask section 106 includes aperture pattern 118 formed as a rectangle with a first length 130 and first width 132. As seen in FIG. 1c, mask section 108 includes aperture pattern 120 formed as a rectangle with a second length 134 and a second width 136. Aperture pattern 120 can be considered to be transversely located with respect to the first aperture 118 (see FIG. 1b). That is, the length 134 is perpendicular to length 130.

FIG. 2 is a perspective view of the present invention multi-pattern shadow mask laser annealing system. The system 200 comprises a laser and associated optics system (not shown) to supply a laser beam that is represented by reference designator 202. Also shown is a shadow mask 100, as described in detail above. A lens 203 projects the laser beam after it passes through the mask apertures.

The laser supplies a beam 202 which can be defined as a rectangle with a length 204 and a width 206. The length 204 and width 206 of the beam match the length (122) and width (124) of the mask sections (see FIG. 1a). The beam dimensions need not necessarily match the mask section dimensions, but a close match promotes efficiency.

As shown with reference designator 208, the laser is capable of transverse movement to supply a beam in a first orientation (as shown) with respect to the shadow mask, and a second orientation (not shown), transverse to the first orientation. This transverse movement permits the laser beam 202 to be moved over transversely oriented mask sections. If the mask includes no transverse sections, the laser beam need not be capable of transverse movement.

Also shown is a silicon substrate 210 with a plurality of typically rectangular substrate regions. These regions are seen as panels in FIG. 6, described below. Alignment marks 212 and 214 are formed in at least two of the corners of each substrate region 216 (see FIG. 1a, reference designators 126 and 128). A plurality of polycrystalline patterns are formed in the substrate region 216 in response to laser annealing with one of the shadow mask sections. As described in more detail below, the substrate includes polycrystalline patterns laterally grown in a first direction in response to the first mask first aperture pattern and polycrystalline pattern laterally grown in a second direction, transverse to the first direction, in response to the second mask section second aperture pattern.

Functional Description

To fabricate an LCD using the above-described shadow mask annealing process, a Si precursor film, preferably amorphous Si film deposited by a plasma CVD (Chemical Vapor Deposition) having a thickness of 50 nanometers (nm), is formed over a protective layer (not shown) on a glass, quartz, or plastic substrate (not shown). The protective layer is typically a silicon oxide film having a thickness of 500 nm.

The laser beam irradiates a section of the shadow mask and the aperture pattern of the mask is projected through the lens on the Si precursor film. The laser beam can be generated by a XeCl excimer laser. As shown, the optical system has capability of rotating at least 90 degrees. The projection optical system is shown as a lens, but it can be an equivalent projection or a magnificent projection system. In the case of an equivalent projection system, the energy density of the laser may be great enough to damage to the shadow mask. Therefore, a durable mask material must be used, or a technique of beam splitting and re-synthesis before and after irradiation of the mask is required.

As shown in FIG. 1, the shadow mask has a plurality of sections with different aperture patterns arranged in the sections. The section dimensions are smaller than, or preferably match the beam dimensions. The aperture layout of each section is designed to crystallize a seed portion in the underlying substrate, and laterally grow the Si island patterns in the direction that matches the channel of the subsequently formed TFTs. The relationship between the aperture layout and the poly-Si islands is dependent upon the degree of magnification in the projection optical system. Preferably, the degree of magnification matches the exposure apparatus photolithography process. Preferably, the degree of magnification degree is 1:1.

The mask sections are selected for lateral growth in a particular direction. That is, some mask sections have apertures for laterally growing a crystal structure in a first direction on the substrate, while other mask sections have apertures for laterally growing crystal is a second direction that is transverse (perpendicular) to the first direction.

Figure 3A:
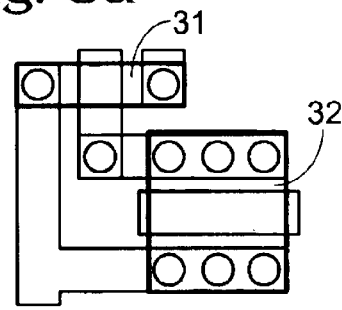
FIGS. 3a through 3c are diagrams illustrating the use of different mask sections to promote lateral growth in transverse directions.
Figure 3B:
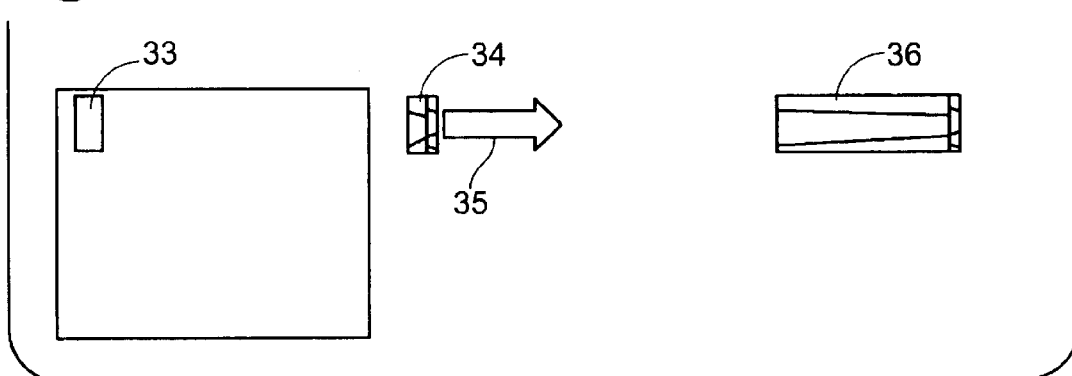
Figure 3C:
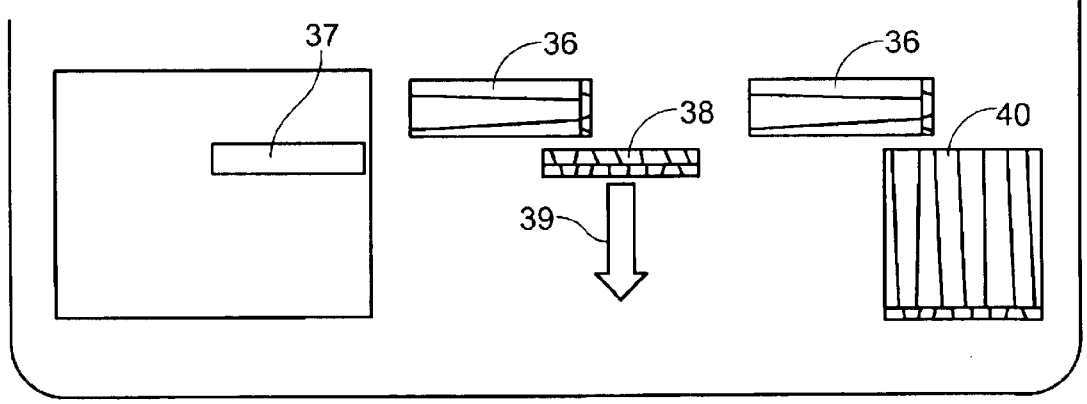

FIGS. 3a through 3c are diagrams illustrating the use of different mask sections to promote lateral growth in transverse directions. FIG. 3a is a plan view of TFT with a first channel area 31 and a second channel area 32.

FIG. 3b is a plan view of a first mask pattern with a first aperture 33. Aperture pattern 33 is used to form the first channel area 31 of FIG. 3a. An initial shot through the aperture 33 produces a seed crystal area 34 on the silicon substrate. As the mask, and more specifically the aperture 33, is stepped across the substrate in the first direction 35, the seed crystal is laterally grown. The laterally grown crystals are represented by reference designator 36.

FIG. 3c illustrates the next step in the crystallization process. After area 36 is formed, a second mask section is used with an aperture pattern 37, and the laser beam is rotated. Aperture pattern 37 is used to for the channel region 32 of FIG. 3a. An initial shot through the aperture 37 produces a seed crystal area 38 on the silicon substrate. As the mask, and more specifically the aperture 37, is stepped across the substrate in the second direction 39, the seed crystal is laterally grown 40. Note that the first direction 35 is transverse to the second direction 39. Lateral growth areas 36 and 40 are subsequently formed into the channel regions 31 and 32 shown in FIG. 3a. In a similar manner, alternate mask sections with different aperture patterns can be used to create additional channel region shapes on a substrate.

Figure 4:
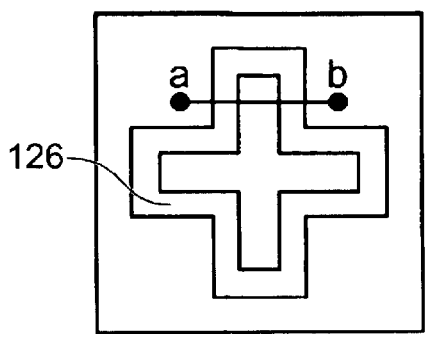
FIGS. 4 and 5 illustrate the mask registration section in detail and the resultant alignment mark formed in a substrate, in response to using the registration section.
Figure 5:
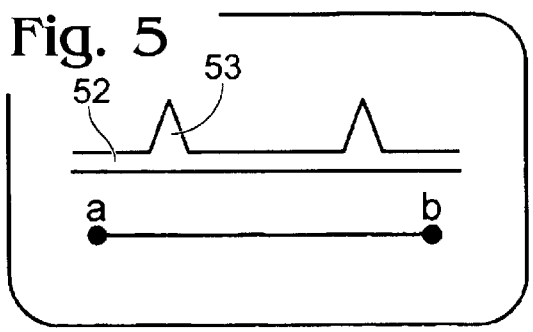

FIGS. 4 and 5 illustrate the mask registration section in detail and the resultant alignment mark formed in a substrate, in response to using the registration section. FIG. 4 is a plan view of the mask registration section 128 of FIG. 1. FIG. 5 is cross-sectional view (a–b) of FIG. 4. Before the crystallization procedure, an alignment mark is projected on the Si precursor film at a predetermined location. The aperture pattern shown in FIG. 4 is "cross-shaped", but other patterns would also be practical. Irradiating a laser beam through the pattern leads to the ridge 53 of the Si film 52 that can be detected by a pattern recognition system installed in a photolithography exposure apparatus.

Figure 6:
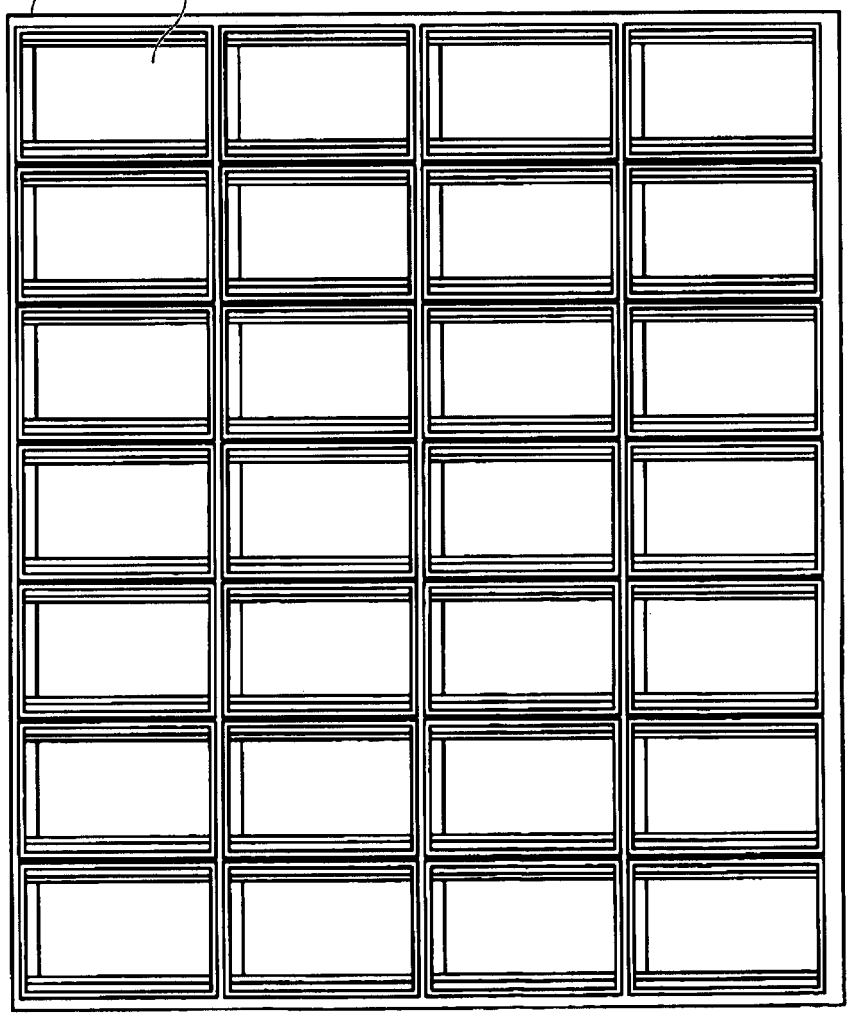
FIG. 6 is a plan view of a liquid crystal display substrate with a plurality of panels, of which the first panel is exemplary.

FIG. 6 is a plan view of a liquid crystal display substrate 61 with a plurality of panels, of which the first panel 62 is exemplary. Assuming that a panel corresponds to one shot of the exposure in a photolithograph step, the panel layout would require at least one alignment mark, as described above.

FIG. 7 is a detailed depiction of the first panel 62 of FIG. 6. Alignment marks 76 and 77 are made as described above.

The areas of data line driver circuits 72 and 73, and scan line driver circuits 74 are crystallized through three different corresponding sections of the shadow mask. The pixel region 75 is crystallized as sub-areas (separated by dotted lines), where each sub-area is formed using the same shadow mask section. That is because each sub-area forms the same arrangement of TFTs. Alternately, some of the sub-areas can have different TFT layouts and, as a result, are formed using different shadow mask sections.

After the crystallization process, the silicon islands are defined through the conventional photolithography process steps, followed by the conventional process steps to complete TFT device. The application of the present invention poly-Si process is not limited to liquid crystal displays. It can also be used to fabricate other products like sensors, data processors, and the like.

FIG. 8 is a flowchart illustrating the present invention multi-pattern shadow mask method for laser annealing. Although this method is depicted as a sequence of numbered steps for clarity, no order should be inferred from the numbering unless explicitly stated. It should be understood that some of these steps may be skipped, performed in parallel, or performed without the requirement of maintaining a strict order of sequence. The methods start at Step 800. Step 802 supplies a silicon substrate. Step 804 creates substrate alignment marks. Step 806, with respect to the alignment marks, laser anneals a substrate region in a plurality of aperture patterns. Step 808 forms a corresponding plurality of polycrystalline regions. Step 810 forms a corresponding plurality of transistor channel regions in the plurality of polycrystalline regions. When the substrate is silicon, Step 810 forms polysilicon regions.

In some aspects of the method, laser annealing a substrate region in a plurality of aperture patterns with respect to the alignment marks in Step 806 includes forming a rectangular substrate region with alignment marks in at least two substrate region corners.

In other aspects, laser annealing in a plurality of aperture patterns in Step 806 includes substeps. Step 806a laser anneals a first substrate region with a first pattern. Step 806b laser anneals a second substrate region with a second pattern.

In some aspects, laser annealing in a first substrate region with a first aperture pattern in Step 806a includes substeps. Step 806a1 laser anneals a first area of the first substrate region with the first aperture pattern. Step 806a2 step-and-repeat laser anneals in a second area, adjacent the first area, in the substrate region. Typically, the step-and-repeat annealing process includes the repetition of Step 806b2 many times. Then, forming a corresponding plurality of polycrystalline regions in Step 808 includes laterally growing crystals in response to the step-and-repeat laser annealing process. Other polycrystalline regions are formed through equivalent substeps.

In some aspects, Step 801a supplies a multi-pattern shadow mask with a plurality of aperture patterns. Then, laser annealing in a plurality of aperture patterns in Step 806 includes using the shadow mask to create the plurality of aperture patterns. Typically, the shadow mask includes a plurality of sections, each section having at least one aperture pattern. Then, using the shadow mask to create the plurality of aperture patterns in Step 806 includes selecting a shadow mask section to create a corresponding aperture pattern in the substrate.

In some aspects, supplying a shadow mask with a plurality of sections in Step 801a includes supplying a shadow mask with a first section having a first aperture pattern and a second section having a second aperture pattern. Then, using the shadow mask to create the plurality of aperture patterns in Step 806 includes other substeps. For example, Step 806a can laser anneal with a first aperture pattern in response to using the shadow mask first section. Likewise, Step 806b can laser anneal with a second aperture pattern in response to using the shadow mask second section.

In other aspects, supplying a shadow mask with a plurality of sections in Step 801a includes each shadow mask section having a plurality of aperture patterns. Then, Step 806 includes creating a plurality of aperture patterns in response to using each shadow mask section. Using the shadow mask to create the plurality of aperture patterns can include other substeps. Step 806e selects a first mask section with a plurality of aperture patterns. Step 806f, using the alignment marks, aligns a substrate region with the first mask. The alignment marks may have been formed earlier in the process. Step 806g uses the first mask section to step-and-repeat laser anneal regions in the substrate with the plurality of aperture patterns. Step 806h selects a second mask section with a plurality of aperture patterns. Step 806i using the alignment marks, aligns a substrate region with the second mask. Step 806j uses the second mask section to step-and repeat laser anneal regions in the substrate with the plurality of aperture patterns. Then, forming polycrystalline regions in a plurality of patterns in Step 808 includes substeps. Step 808a forms a plurality of polycrystalline patterns in response to laser annealing with the first mask section. Step 808b forms a plurality of polycrystalline patterns in response to laser annealing with the second mask section.

In some aspects, forming a corresponding plurality of transistor channel regions in Step 810 includes forming a liquid crystal display (LCD) panel with regions such as pixel regions, gate driver regions, source driver regions, digital-to-analog converter regions, analog amplifier regions, shift register regions, memory regions, and microprocessor regions.

In other aspects of the method, supplying a shadow mask with a plurality of sections in Step 801a includes supplying a shadow mask with a first section having a first aperture pattern and a second section having a second aperture pattern. Then, using the shadow mask to create the plurality of aperture patterns in Step 806 includes other substeps. For example, Step 806g may step-and-repeat laser anneal in a first direction on the substrate using the first aperture pattern of the shadow mask first section. Step 806j may step-and-repeat laser anneal in a second direction, transverse to the first direction, on the substrate using a second aperture of the shadow mask second section.

Some aspects the method further comprises a step, Step 801b, of supplying a transverse orienting laser beam. Then, laser annealing in the first direction in Step 806k includes orienting the laser beam in a first orientation. Laser annealing in the second direction in Step 806l includes orienting the laser beam in a second orientation, transverse to the first orientation.

A system and method for laser annealing using a multi-section shadow mask have been provided. Examples have been provided for a shape and organization of the mask, but other possibilities are practical. Examples have also been given for the use and end-products resulting from the use of the mask, however, the present invention is not limited to just these examples. Other variations and embodiments will occur to those skilled in the art.

We claim:

1. A multi-pattern shadow mask method for laser annealing, the method comprising:

creating substrate alignment marks;

with respect to the alignment marks, laser annealing a substrate region in a plurality of aperture patterns, which includes,
 laser annealing a first area of a first substrate region with a first aperture pattern;
 step-and-repeat laser annealing in a second area, adjacent the first area, in the substrate region; and,
 forming a corresponding plurality of polycrystalline regions which includes laterally growing crystals in response to the step-and repeat laser annealing process.

2. The method of claim 1 further comprising:

forming a corresponding plurality of transistor channel regions in the plurality of polycrystalline regions.

3. The method of claim 1 further comprising:

supplying a silicon substrate; and, wherein forming a corresponding plurality of polycrystalline regions includes forming polysilicon regions.

4. The method of claim 3 wherein creating substrate alignment marks includes forming a rectangular substrate region with alignment marks in at least two corners of the substrate region.

5. The method of claim 4 wherein laser annealing in a plurality of aperture patterns includes:

laser annealing a first substrate region with a first aperture pattern; and, laser annealing a second substrate region with a second aperture pattern.

6. The method of claim 5 further comprising:

supplying a multi-pattern shadow mask with a plurality of aperture patterns; and, wherein laser annealing in a plurality of aperture patterns includes using the shadow mask to create the plurality of aperture patterns.

7. The method of claim 6 wherein supplying a multi-pattern shadow mask with a plurality of aperture patterns includes supplying a shadow mask with a plurality of sections, each section having at least one aperture pattern; and, wherein using the shadow mask to create the plurality of aperture patterns includes selecting a shadow mask section to create a corresponding aperture pattern in the substrate.

8. The method of claim 7 wherein supplying a shadow mask with a plurality of sections, each section having at least one aperture pattern, includes supplying a shadow mask with a first section having a first aperture pattern and a second section having a second aperture pattern; and, wherein using the shadow mask to create the plurality of aperture patterns includes:
 laser annealing with a first aperture pattern in response to using the shadow mask first section; and,
 laser annealing with a second aperture pattern in response to using the shadow mask second section.

9. The method of claim 8 wherein supplying a shadow mask with a plurality of sections, each section having at least one aperture pattern, includes each shadow mask section having a plurality of aperture patterns; and, wherein using the shadow mask to create the plurality of aperture patterns includes creating a plurality of aperture patterns in response to using each shadow mask section.

10. The method of claim 9 wherein using the shadow mask to create the plurality of aperture patterns includes:

selecting a first mask section with a plurality of aperture patterns;

using the alignment marks, aligning a substrate region with the first mask;

using the first mask section to step-and-repeat laser anneal regions in the substrate with the plurality of aperture patterns;

selecting a second mask section with a plurality of aperture patterns;

using the alignment marks, aligning a substrate region with the second mask;

using the second mask section to step-and repeat laser anneal regions in the substrate with the plurality of aperture patterns; and, wherein forming polycrystalline regions in a plurality of patterns includes:

forming a plurality of polycrystalline patterns in response to laser annealing with the first mask section; and, forming a plurality of polycrystalline patterns in response to laser annealing with the second mask section.

11. The method of claim 10 wherein forming a corresponding plurality of transistor channel regions in the plurality of polycrystalline regions includes forming a liquid crystal display (LCD) panel with regions selected from the group including pixel regions, gate driver regions, source driver regions, digital-to-analog converter regions, analog amplifier regions, shift register regions, memory regions, and microprocessor regions.

12. The method of claim 7 wherein supplying a shadow mask with a plurality of sections, each section having at least one aperture pattern, includes supplying a shadow mask with a first section having a first aperture pattern and a second section having a second aperture pattern; and, wherein using the shadow mask to create the plurality of aperture patterns includes:

step-and-repeat laser annealing in a first direction on the substrate using the first aperture pattern of the shadow mask first section; and, step-and-repeat laser annealing in a second direction, transverse to the first direction, on the substrate using a second aperture of the shadow mask second section.

13. The method of claim 12 further comprising:

supplying a transverse orienting laser beam;

wherein laser annealing in the first direction includes orienting the laser beam in a first orientation; and, wherein laser annealing in the second direction includes orienting the laser beam in a second orientation, transverse to the first orientation.

14. A multi-pattern shadow mask method for laser annealing, the method comprising:

supplying a silicon substrate;

supplying a multi-pattern shadow mask with a first section having a plurality of aperture patterns and a second section having a plurality of aperture patterns;

forming rectangular substrate regions with alignment marks in at least two corners of each substrate region;

using the alignment marks, aligning a first substrate region with the shadow mask first section;

with respect to the alignment marks, laser annealing a first plurality of areas in the first substrate region with the shadow mask first section;

step-and-repeat laser annealing in a second plurality of areas, adjacent the first plurality of areas, in the first substrate region;

using the alignment marks, aligning a second substrate region with the shadow mask second section;

laser annealing the second substrate region with the shadow mask second section;

step-and-repeat laser annealing in a second plurality of areas, adjacent the first plurality of areas, in the second substrate region; and, forming a plurality of polysilicon patterns in the first and second substrate regions by laterally growing crystals in response to the step-and-repeat laser annealing process.

* * * * *